(12) United States Patent
Keite-Telgenbüscher et al.

(10) Patent No.: US 10,529,923 B2
(45) Date of Patent: Jan. 7, 2020

(54) METHOD FOR REMOVING PERMEATES FROM SHEET MATERIAL

(71) Applicant: TESA SE, Hamburg (DE)

(72) Inventors: Klaus Keite-Telgenbüscher, Hamburg (DE); Christian Schuh, Hamburg (DE); Anita Reichenbach, Bruchhausen-Vilsen (DE)

(73) Assignee: tesa SE, Norderstedt (DE)

( * ) Notice: Subject to any disclaimer, the term of this patent is extended or adjusted under 35 U.S.C. 154(b) by 0 days.

(21) Appl. No.: 15/112,733

(22) PCT Filed: Dec. 23, 2014

(86) PCT No.: PCT/EP2014/079132
§ 371 (c)(1),
(2) Date: Jul. 20, 2016

(87) PCT Pub. No.: WO2015/106940
PCT Pub. Date: Jul. 23, 2015

(65) Prior Publication Data
US 2016/0336513 A1    Nov. 17, 2016

(30) Foreign Application Priority Data

Jan. 20, 2014 (DE) ........................ 10 2014 200 948

(51) Int. Cl.
*H01L 51/00* (2006.01)
*C08J 5/18* (2006.01)
(Continued)

(52) U.S. Cl.
CPC ............ *H01L 51/0025* (2013.01); *B32B 7/12* (2013.01); *C08J 5/18* (2013.01); *C08J 7/06* (2013.01);
(Continued)

(58) Field of Classification Search
CPC .. C08J 5/18; C08J 7/06; C08J 2321/00; H01L 51/0025; B32B 7/12; B32B 2307/51; B32B 2307/726
See application file for complete search history.

(56) References Cited

U.S. PATENT DOCUMENTS 6,059,860 A    5/2000  Larson
6,291,061 B1   9/2001  LeMay et al.
(Continued)

FOREIGN PATENT DOCUMENTS

DE    102011089565 A1   6/2013
EP         1407818 A1   4/2004
(Continued)

OTHER PUBLICATIONS

German Search Report for corresponding application DE 10 2014 200 948.0 dated Sep. 11, 2014.
(Continued)

*Primary Examiner* — Thanh T Nguyen
(74) *Attorney, Agent, or Firm* — Norris McLaughlin, P.A.

(57) ABSTRACT

The invention relates to a method for absorbing permeates from a sheet material I, as used, for example, in organic electronic structures, this method being easy to carry out. Such a method includes, according to the invention, directly or indirectly bringing sheet material I into planar contact with a sheet material II, which contains at least one getter material and is capable of absorbing at least one permeate from sheet material I, there being no adhesive connection between sheet material I and sheet material II.

11 Claims, 2 Drawing Sheets

(51) Int. Cl.
*C08J 7/06* (2006.01)
*B32B 7/12* (2006.01)

(52) U.S. Cl.
CPC ..... *B32B 2307/51* (2013.01); *B32B 2307/726* (2013.01); *C08J 2321/00* (2013.01)

(56) References Cited

U.S. PATENT DOCUMENTS

| | | |
|---|---|---|
| 2003/0143423 A1 | 7/2003 | McCormick et al. |
| 2004/0043249 A1* | 3/2004 | Su .................. H05B 33/04 428/690 |
| 2007/0142484 A1 | 6/2007 | Carcich |
| 2007/0152212 A1* | 7/2007 | Cho .................. H01L 51/5256 257/40 |
| 2010/0261006 A1 | 10/2010 | Naerhi et al. |
| 2010/0272933 A1 | 10/2010 | McCormick et al. |
| 2011/0140119 A1 | 6/2011 | Oh et al. |
| 2012/0231266 A1 | 9/2012 | Saitoh et al. |
| 2013/0140545 A1 | 6/2013 | Kim et al. |
| 2014/0363603 A1 | 12/2014 | KeiteTelgenbüscher et al. |

FOREIGN PATENT DOCUMENTS

| | | |
|---|---|---|
| EP | 2607439 A1 | 6/2013 |
| JP | 01091861 | 4/1989 |
| JP | 200926648 A | 2/2009 |
| JP | 2009123532 A | 6/2009 |
| JP | 2010003716 A | 1/2010 |
| JP | 2010129334 A | 6/2010 |
| JP | 2010140705 A | 6/2010 |
| JP | 2010232629 A | 10/2010 |
| JP | 2011031422 A | 2/2011 |
| JP | 2011124219 A | 6/2011 |
| JP | 2011165554 A | 8/2011 |
| JP | 2013501312 A | 1/2013 |
| JP | WO2011065252 A1 | 4/2013 |
| JP | 2013132908 A | 7/2013 |
| TW | 201229179 A | 7/2012 |
| WO | 2011014307 A1 | 2/2011 |
| WO | 2012062586 A1 | 5/2012 |

OTHER PUBLICATIONS

International Search Report and Wriiten Opinion for corresponding application PCT/EP2014/079132 dated Apr. 2, 2015.
Translation of Taiwanese Office Action for corresponding application TW 103146246 dated Feb. 18, 2018.
English Translation of Japanese Office Action in corresponding application JP2016-564388 dated Oct. 24, 2018.

* cited by examiner

METHOD FOR REMOVING PERMEATES FROM SHEET MATERIAL

This application is a § 371 U.S. National stage of PCT International Patent Application No. PCT/EP2014/079132, filed Dec. 23, 2014, which claims foreign priority benefit of German Patent Application No. DE 10 2014 200948.0, filed Jan. 20, 2014, the disclosures of each of which patent applications are incorporated herein by reference.

The invention concerns the technical field of removing permeates from flat structures. In particular, a method for removing particularly small amounts of permeates from a flat structure which is used in organic electric devices is proposed.

In principle, the removal from flat structures of permeates—such as water—is already known from general life experience. An example is the drying of plants or parts thereof, such as leaves, for preparing a herbarium. In this case, the plant parts to be dried are often placed between sheets of paper and pressed, resulting in a tight contact. On the one hand, the pressure forces the moisture from the plant parts into the absorbing paper, but on the other, during long-term storage, water also diffuses from the plant parts into the paper, causing the plant parts to dry out. In order to prevent the dried plant parts from being damaged when they are removed, there must be no adhesion between them and the drying paper sheets.

However, this method is only suitable for reducing the water content of the plant parts to a few percent, because at that point, the equilibrium moisture of the drying medium (paper in this case) is reached, and the paper cannot take up any further moisture. The method is therefore unsuitable for achieving very low moisture levels, such as below one percent, in a flat structure to be dried.

However, particularly in the manufacture, storage, transport, and processing of components of electronic structures, in particular organic electronic structures, such low permeate content, e.g. water content, is usually required, as these components will otherwise be damaged.

(Opto)electronic devices are now being used in commercial products with increasing frequency or are about to be introduced into the market. Such devices comprise inorganic or organic electronic structures, for example organic, organometallic or polymeric semiconductors, and also combinations thereof. Depending on the desired application, the corresponding products are stiff or flexible, with there being an increasing demand for flexible devices. Such devices are often manufactured by means of printing processes such as relief printing, gravure printing, silkscreen printing, planographic printing, or also so-called "non impact-printing" processes such as e.g. thermal transfer printing, inkjet printing, or digital printing. In many cases, however, vacuum methods such as chemical vapor deposition (CVD), physical vapor deposition (PVD), plasma-enhanced chemical or physical deposition processes (PECVD), sputtering, (plasma) etching, or vapor deposition are also used. Patterning is carried out as a rule by means of masking.

One can cite here, as examples of organic or inorganic applications that are already commercially available or show interesting market potential, electrophoretic or electrochrome structures or displays, organic or polymeric light-emitting diodes (OLEDs or PLEDs) used in readout and display devices or as lighting; as well as electroluminescent lamps, light-emitting electrochemical cells (LEECs), and organic solar cells such as dye or polymer solar cells; in addition, inorganic solar cells, particularly thin-layer solar cells, for example based on silicon, germanium, copper, indium, and selenium, or perovskite cells; organic field effect transistors, organic switching elements, organic optical amplifiers, organic laser diodes, organic or inorganic sensors, and organically or inorganically based RFID transponders.

In achieving sufficient useful life and function of (opto) electronic devices in the field of inorganic and organic optoelectronics, and especially in organic (opto)electronics, protecting the components contained therein from permeates is to be seen as a technical challenge. In this case, permeates are as a rule considered to be gaseous or liquid substances that enter a solid and possibly penetrate or permeate it. Accordingly, many low-molecular-weight organic or inorganic compounds may be permeates, with water vapor and oxygen being of particular significance in the context described here.

Numerous optoelectronic devices—particularly when organic materials are used—are sensitive to both water vapor and oxygen. During the useful life of electronic devices, protection by encapsulation is therefore necessary, as performance will otherwise decline over the period of application. For example, if protection is insufficient, oxidation or hydrolysis processes may cause a dramatic decrease over a short period in luminosity in electroluminescent lamps (EL lamps) or organic light-emitting diodes (OLED), contrast in electrophoretic displays (EP displays), or efficiency in solar cells.

In addition to protection from penetrating permeates, however, the removal of harmful permeates from many materials used in the structure of the electronic device itself is also absolutely necessary. In particular, the polymeric substrate, covering, or adhesive films frequently used in flexible structures often themselves contain harmful permeates, particularly water, with the result that these materials must be dried by costly methods.

Moreover, particularly in the continuous production of flat electronic devices, materials are used that function only as auxiliary materials, such as temporary substrate materials, for example, on which e.g. discrete units are placed and transported in successive processing stages. Auxiliary materials, only parts of which remain in the electronic structure, are also used, and are accordingly to be provided in permeate-free form as far as possible.

In particular, for example, a substrate film such as that used in "Laser-Induced Thermal Imaging" (LITI) for the preparation and transfer of the organic light-emitting layer must be used in permeate-free form, as it comes into direct contact with the sensitive material.

Furthermore, intermediate stages in the production of flat electronic structures are sometimes coated or printed with materials that are present in an aqueous dispersion. For example, e.g. electron or hole transport layers are manufactured from intrinsically conductive polymers such as Clevios (PEDOT:PSS; Heraeus Precious Metals). Water must be removed to a high degree from such layers by means of costly processes, as they come into direct contact with the sensitive materials.

However, methods for drying or keeping dry flat structures are also used in other fields of application, e.g. in the pharmaceutical industry in the production and storage of medicated patches or medical diagnostic strips, in chemical analysis in the extraction of substances to be analyzed, or more generally for covering sensors.

Medicated patches or transdermal therapeutic systems (TTS, TDS) were introduced on the market in 1979 and are widely used today with a series of active ingredients. By means of these systems, which are comparable with conventional patches, active ingredients (e.g. hormones, nicotine, etc.) are transdermally administered through the skin. The advantage of this administration form is that the active ingredient is transferred directly into the bloodstream, bypassing the gastrointestinal tract. This spares the gastrointestinal system and reduces metabolism of the active ingredient by the hepatic system before it reaches the site of action. Moreover, acceptance by the patient (compliance) is improved because the systems are applied only at long intervals rather than daily. The situation is similar with orally-administered soluble films (oral dissolvable films, ODF).

The advantages of TTS and ODF could be manifested even more clearly if the release of the active ingredient from such systems took place interactively and in a controlled manner. This includes e.g. the release or mobilization of active ingredients by means of permeates, including e.g. water vapor or oxygen, which cannot penetrate into the system until after application. Accordingly, there is a need to remove the permeate from such medicated patches after production and to keep them permeate-free, and to make them available to patients.

Methods for absorbing permeates from flat structures by means of getter-material-containing flat structures are generally known in the prior art.

For example, U.S. Pat. No. 6,103,141 describes hot melt adhesive filled with a desiccant that is provided in the form of an adhesive tape. This tape is attached to the inner side of a container in order to keep the container space dry. In a preferred embodiment, the hot melt adhesive filled with the desiccant is coated onto one side of a substrate material, and the other side of the substrate material is coated with another adhesive filled with a desiccant, which then in application bonds to the container wall. This structure is intended to keep the gas space containing a sensitive material dry, and therefore does not come into contact with the material to be dried, causing drying times to be long.

U.S. Pat. No. 6,139,935 describes an oxygen-absorbing label that is glued onto the inner side of a container and also keeps the container space free of oxygen.

DE 19913761 A1 describes a flat and activatable drying device for reducing the moisture content of a gas space surrounding the device and a production method for such a device. In this case, the desiccant may also be incorporated into a pressure-sensitive adhesive layer. In this case as well, the gas space around the sensitive material is dried. The substrate to which the pressure-sensitive adhesive layer is fixed is unavoidably dried, but this is unimportant for the application.

The subject matter of EP 0582968 B1 is a film composite with a water vapor barrier that is composed of a plastic film, an adhesive layer formed by a solvent-containing or solvent-free adhesive or a hot melt adhesive, which contains 10 to 50 wt. % of a finely-dispersed water-absorbing polymer powder (SAP), as well as a second plastic film attached to the first plastic film via this adhesive layer. This type of film composite is used for packaging moisture-sensitive products. The water-absorbing adhesive layer filled with a desiccant retards the penetration of water through the film composite. Penetration of water into the package is thus substantially reduced.

U.S. Pat. No. 6,112,888 discloses a hot melt adhesive composition of a polymer and a desiccant that is also used for maintaining or creating a dry packing atmosphere. The composition is applied to the inside of a package from the melt, e.g. by extrusion or spraying, but can also be directly applied to the filling material. On direct application to the filling material, it can be assumed that the composition will remain attached to said material because of its adhesive properties. In any case, these adhesive properties give rise to the risk that the filling material will be damaged on removal.

U.S. Pat. No. 6,936,131 describes an encapsulation method for organic electronic structures in which a transfer adhesive tape containing a desiccant is used to prevent bonding of the substrate and covering. The desiccant retards the permeation of water vapor through the adhesive joints into the electronic structure. The adhesive tape permanently remains in the structure. A drawback is that the transparency of the structure is impaired by the desiccant contained in the tape.

The use of flat structures, often configured as an adhesive tape, for the drying of gas spaces or as a permeation barrier in adhesive joints is therefore known in the art. In addition, however, there is also a need for methods of efficiently drying flat structures in which the drying means used neither damage the flat structure nor essentially alter its optical properties, but efficiently dry the structures by means of planar contact with one another.

Flat structures, particularly those manufactured or produced in a continuous process in the shape of a strip, are difficult to manufacture in a permeate-free, and particularly a dry manner, and it is difficult to remove permeate from them because of their often large dimensions and the fact that they are often present in wound form on a roll or as a stack. Because of their high surface/volume ratio, they also readily absorb permeate from the environment, i.e., the permeate must again be removed before they are placed in a permeate-free environment or come into contact with permeate-sensitive materials.

The object of the invention is therefore to provide an easy-to-implement and effective method and a suitable device for absorbing permeates from flat structures, in particular those used as components in organic electronic structures and/or those in the form of a roll or stack.

The achievement of this object is based on the idea of using a correspondingly configured, permeate-absorbing flat structure.

A first object of the invention is therefore a method for removing permeates from a flat structure I that is at least partially used in the structure of an organic electronic device, comprising the (direct or indirect) bringing into planar contact of the flat structure I with a flat structure II containing at least one getter material and capable of taking up at least one permeate from the flat structure I, with no adhesive bonding taking place between the flat structures I and II.

This is advantageous in that, because of the planar contact with the flat structure I to be dried, high drying efficiency is achieved, and because of the non-adhesive properties, easy and damage-free removal of the flat structure II to be dried becomes possible.

According to the invention, "direct bringing into contact" means that the flat structures I and II come into direct contact with each other. "Indirect bringing into contact" means that further layers may be arranged between the flat structures I and II, which must of course allow sufficient permeation of the permeate. According to the invention, however, the permeate is not to be forced through a gas space in order to travel from the flat structure I to the flat structure II. Gas spaces inside organic electronic structures are disadvantageous, for example because they can impair light decoupling. Preferably, the flat structure I and flat structure II are directly brought into contact with each other.

The flat structure II preferably does not remain in the organic electronic device. In particular, it is removed from the flat structure II before beginning to use the flat structure I in the structure of the organic electronic device.

Because the flat structure II does not remain in the structure of the organic electronic device, possible chemical interactions between the getter material and electronically active materials are prevented. The gas space that surrounds getter pads in organic electronic devices according to the prior art having a getter pad that remains in place is also eliminated, resulting in higher light coupling and decoupling in optoelectronic devices (e.g. solar cells or OLEDs), as there are fewer interfaces in the light path having widely differing refractive indices.

In a preferred embodiment, bringing into contact of the flat structure takes place in such a way that the composite of the flat structure I from which the permeate is to be removed and the flat structure II that takes up permeate is configured in alternating layers, also e.g. as a stack or a roll. This allows particularly intense contact, and depending on the device, also provides the flat structure taking up the permeate with a dual-sided action and intercepts additional permeate penetrating from the environment.

A "flat structure" is understood to refer to a flat arrangement of a system whose dimensions are significantly smaller in one spatial direction (thickness or height) than in the other two spatial directions that define maximum extension (length and width). According to the invention, this type of flat structure may be configured either in a compact or pierced manner and consist of a single material or various materials. A flat structure may show constant thickness over its entire surface area or also have differing thicknesses. In addition, it may consist of one or several layers, which may be arranged in a congruent or at least partially non-overlapping manner.

The flat structure I from which permeate is to be removed is e.g. a polymer film, particularly a substrate, covering, or adhesive film or a substrate film, a thin glass film, a metal film, an adhesive tape, or a layer that can be arranged on a substrate film and/or part of a layered composite and is used in an (opto)electronic structure, e.g. an anode layer, a cathode layer, a hole or electron transport layer, or a semiconductor layer, in particular a light-emitting layer such as that used e.g. in the LITI method.

An adhesive tape is understood to refer to a substrate material coated with at least one pressure-sensitive adhesive or at least one activatable adhesive, or to a pressure-sensitive adhesive in the form of a flat structure or an activatable adhesive in permanent form. An adhesive tape is generally deemed to be a flat structure due to its shape. Tapes with extended length and limited width, tape sections, labels, blanks and the like are also included in the designation "adhesive tape." Not included, on the other hand, are cured and not-yet cured liquid adhesives or bonded materials manufactured therewith.

According to the invention, a planar contact or the connection between the flat structures I and II is generally considered to be non-adhesive if it shows bonding strength of <0.5 N/cm, and preferably <0.05 N/cm. A planar contact between one of the flat structures of the invention and a pressure-sensitive adhesive is always considered to be adhesive according to the invention, even if the bonding strength in an individual case is below the above-defined bonding strength.

Known pressure-sensitive adhesives include those based on acrylates and/or methacrylates, polyurethanes, natural rubbers, synthetic rubbers; styrene block copolymer compounds with an elastomer block of unsaturated or hydrated polydiene blocks such as e.g. polybutadiene, polyisoprene, copolymers of the two, polybutylene, particularly polyisobutylene, as well as other elastomer blocks known to the person having ordinary skill in the art; polyolefins, particularly poly-α-olefins and/or polyisobutylene; fluoropolymers and/or silicone. The term "pressure-sensitive adhesive" also includes other compounds having pressure-sensitive adhesive properties according to the "Handbook of Pressure-Sensitive Adhesive Technology" by Donatas Satas (Satas & Associates, Warwick 1999).

The flat structure used in the method according to the invention contains at least one getter material. Here, the flat structure itself may consist completely of the getter material, contain a layer of the getter material, or comprise at least one layer containing a getter material. The flat structure may also contain further layers, e.g. a substrate layer, a contact layer, a permeation barrier layer, or specific outer layers.

Here, "getter material" is understood to refer to a material that is capable of taking up (sorption) one or more substance(s) capable of permeation. Taking up of the substance(s) capable of permeation by the getter material may take place e.g. by absorption or adsorption, wherein adsorption may occur both as chemisorption and physisorption. The getter material could therefore also be referred to as a "sorbent" or "sorption agent."

A "substance capable of permeation" is understood to refer to a substance that can penetrate into the flat structure as a gas or liquid, and if applicable also as a solid, and then permeate it. Such substances were also referred to above and will be referred to below as "permeates." Permeates can originate from the flat structure itself or from the environment. The flat structure itself often contains low-molecular-weight organic compounds such as solvent residues, residual monomers, oils, resin components, softeners, and water. Those originating from the environment frequently include water, volatile organic compounds (VOCs), low-molecular-weight hydrocarbons, and oxygen. The following substances in particular are considered to be "substances capable of permeation" or "permeates:"

Acetonitrile, 1-butanol, chlorobenzene, chloroform (trichloromethane), cyclohexane, diethyl ether, 1,4-dioxane, glacial acetic acid (acetic acid), acetic anhydride, acetic acid ethylester (ethyl acetate, acetic ester), acetic acid-n-butylester (n-butyl acetate), acetic acid tert-butylester (t-butyl acetate), ethanol, methanol, n-hexane, n-heptane, 3-hexanone, 2-propanol (isopropanol), 3-methyl-1-butanol (isoamyl alcohol), methylene chloride (dichloromethane), methyl ethyl ketone (butanone), methyl isobutyl ketone, nitromethane (nitrocarbol), n-pentane, 2-pentanone, 3-pentanone, petroleum ether (light gasoline), benzene, propanol, pyridine (azine), tert-butylmethyl ether, tetrachloroethene (perchloroethene), tetrahydrofuran, toluene, trichloroethane, triethylamine, xylene, oxygen, methane, ethane, propane, propene, butane, butene, carbon dioxide, ozone, sulfur dioxide, and water.

The advantage of a getter-material-containing flat structure in the process of permeate removal is that said getter material eliminates the equilibrium of the permeate in the matrix of the getter-material-containing flat structure, thus allowing better results to be obtained.

Preferably, in the method according to the invention, the flat structure II is at least capable of at least partially absorbing water from the flat structure I. The method according to the invention is therefore in particular a method for the removal of water from a flat structure I that is at least partially used in the structure of an organic electronic device, comprising:

the direct or indirect bringing into planar contact of the flat structure I with a flat structure II containing at least one getter material and capable of taking up at least water from the flat structure I, wherein no adhesive bonding takes place between the flat structures I and II.

Examples of suitable getter materials include: salts such as cobalt chloride, calcium chloride, calcium bromide, lithium chloride, lithium bromide, magnesium chloride, barium perchlorate, magnesium perchlorate, zinc chloride, zinc bromide, aluminum sulfate, calcium sulfate, copper sulfate, barium sulfate, magnesium sulfate, lithium sulfate, sodium sulfate, cobalt sulfate, titanium sulfate, sodium dithionite, sodium carbonate, sodium sulfate, potassium disulfite, potassium carbonate, magnesium carbonate; layered silicates such as montmorillonite and bentonite; metal oxides such as barium oxide, calcium oxide, iron oxide, magnesium oxide, sodium oxide, potassium oxide, strontium oxide, aluminum oxide (activated alumina) and titanium dioxide; further, carbon nanotubes, activated carbon, phosphorus pentoxide and silanes; readily oxidizable metals such as iron, calcium, sodium, and magnesium; metal hydrides such as calcium hydride, barium hydride, strontium hydride, sodium hydride, and lithium aluminum hydride; hydroxides such as potassium hydroxide and sodium hydroxide; metal complexes such as e.g. aluminum acetyl acetonate; moreover, silicic acids such as e.g. silica gel; diatomaceous earth; zeolites; furthermore, organic absorbers such as polyolefin copolymers, polyamide copolymers, PET copolyester, anhydrides of mono- and polycarboxylic acids such as acetic anhydride, propionic anhydride, butyric anhydride or methyltetrahydrophthalic anhydride or other hybrid polymer-based absorbers, which are usually used in combination with catalysts such as cobalt; carbodiimides; other organic absorbers such as e.g. weakly crosslinked polyacrylic acid, polyvinyl alcohol, ascorbate, glucose, gallic acid, or unsaturated fats and oils. With respect to binding of oxygen in particular, organometallic oxidation additives based on chelating amines and transition metal complexes are also advantageously used, particularly in combination with oxidizable substrate materials. According to the invention, mixtures of two or more getter materials may also be used.

In accordance with their function, the getter materials are preferably used as essentially permeate-free materials, for example water-free materials. This distinguishes getter materials from similar materials used as fillers. For example, silica is frequently used as a filler in the form of pyrogenic silicic acid. However, if this filler is stored under environmental conditions, which is the common practice, it absorbs water from the environment and is no longer functional to a technically usable extent as a getter material. Only dry silica or silica kept dry can be used as a getter material. However, it is also possible according to the invention to use materials that are already complexed with permeates, e.g. $CaSO_4 * \frac{1}{2} H_2O$ (calcium sulfate-hemihydrate) or partially hydrated silicic acids, which by definition are present as compounds of the general formula $(SiO_2)_m * nH_2O$.

"Silanes" are understood to be compounds of the general formula $R_a$—Si—$X_{4-a}$ or their partial condensation products. In the formula, a denotes a whole number from 0 to 3, and preferably 0 or 1. X designates a hydrolyzable group, e.g. preferably a halogen atom, particularly chlorine, an alkoxy group such as a methoxy, ethoxy, n-propoxy, iso-propoxy, n-butoxy, sec-butoxy, or tert-butoxy group, or an acetoxy group. Other examples of hydrolyzable groups known to the person having ordinary skill in the art can also be used in the scope of the present invention. If several substituents X are present, these may be the same or different. R denotes an optionally substituted hydrocarbon residue, e.g. a methyl, ethyl, n-propyl, iso-propyl, n-butyl, sec-butyl, tert-butyl group, of pentyl group as well as branched isomers thereof, a hexyl group and branched isomers thereof, a heptyl group and branched isomers thereof, an octyl group and branched isomers thereof, a nonyl group and branched isomers thereof, a decyl group and branched isomers thereof, an undecyl group and branched isomers thereof, a dodecyl group and branched isomers thereof, a tetradecyl group and branched isomers thereof, a hexadecyl group and branched isomers thereof, an octadecyl group and branched isomers thereof, or an eicosyl group and branched isomers thereof. The hydrocarbon residues may also contain ring-shaped and/or aromatic components. Representative structures include cyclohexyl, phenyl, and benzyl groups. The hydrocarbon residue(s) R optionally contain(s) e.g. one or more heteroatom-containing substituents such as amino groups, aminoalkyl groups, glycidyloxy groups, (meth)acryloxy groups and the like. If several substituents R are present, these may be the same or different.

A silane suitable for use as a getter material is preferably selected from the group comprising N-(2-aminoethyl)-3-aminopropyltrimethoxysilane, N-(2-aminoethyl)-3-aminopropyltriethoxysilane, 3-aminopropyltrimethoxysilane, 3-aminopropyltriethoxysilane, 3-aminopropyldiethoxymethylsilane, N-(2-aminoethyl)-3-aminopropyldimethoxymethylsilane, (N-butyl)-3-aminopropyltrimethoxysilane, 3-(N-ethylamino)-2-methylpropyltrimethoxysilane, 4-amino-3,3-dimethylbutyltrimethoxysilane, 4-amino-3,3-dimethylbutyldimethoxymethylsilane, (N-cyclohexyl)-aminomethyldimethoxymethylsilane, (N-cyclohexyl)-aminomethyltrimethoxysilane, (N-phenyl)-3-aminopropyltrimethoxysilane, (N-phenyl)-aminomethyldimethoxymethylsilane, (N-benzyl-2-aminoethyl)-3-aminopropyltrimethoxysilane, [2-(N-benzyl-N-vinylamino)-ethyl]-3-aminopropyltrimethoxysilane hydrogen chloride, [2-(N-benzyl-N-vinylamino)-ethyl]-3-aminopropyltrimethoxysilane, bis-(3-propyltriethoxysilyl)-amine, vinyltrimethoxysilane, vinyltriethoxysilane, vinyl-tri (2-methoxyethoxy)-silane, vinyltriisopropoxysilane, vinyldimethoxymethylsilane, vinyltriacetoxysilane, 3-triethoxysilylpropylsuccinic anhydride, 3-glycidyloxypropyltrimethoxysilane, 3-glycidyloxypropyltriethoxysilane, 2-(3,4-epoxycyclohexyl)-ethyltriethoxysilane, 3-glycidyloxypropyldiethoxymethylsilane, 3-methacryloyloxypropyltrimethoxysilane, 3-methacryloyloxypropyltriethoxysilane, 3-methacryloyloxypropyltriisopropoxysilane, 3-methacryloyloxypropyldimethoxymethylsilane, 3-methacryloyloxypropyldiethoxymethylsilane, 3-chloropropyltrimethoxysilane, 3-chloropropyltriethoxysilane, 3-isocyanatopropyltrimethoxysilane, 3-isocyanatopropyltriethoxysilane, isocyanatomethyltrimethoxysilane, isocyanatomethyldimethoxymethylsilane, tris-[3-(trimethoxysilyl)-propyl]-isocyanurate, 3-ureidopropyltrimethoxysilane, 3-ureidopropyltriethoxysilane, 2-hydroxy-4-(3-triethoxysilylpropoxy)-benzophenone, 4-(3'-chlorodimethylsilylpropoxy)-benzophenone, 3-mercaptopropyltrimethoxysilane, 3-mercaptopropyldimethoxymethylsilane, bis-(3-triethoxysilylpropyl)-disulfane, bis-(3-triethoxysilylpropyl)-tetrasulfane, bis-(3-triethoxysilylpropyl)-polysulfane, and octadecylaminodimethyltrimethoxysilylpropylammonium chloride.

The getter material is preferably selected from the group comprising cobalt chloride, calcium chloride, calcium bromide, lithium chloride, lithium bromide, magnesium chloride, barium perchlorate, magnesium perchlorate, zinc chloride, zinc bromide, aluminum sulfate, calcium sulfate, copper sulfate, barium sulfate, magnesium sulfate, lithium sulfate, sodium sulfate, cobalt sulfate, titanium sulfate, sodium carbonate, sodium sulfate, potassium carbonate, and magnesium carbonate, as well as diatomaceous earth, silicic acids (silica), zeolites, layered silicates, as well as iron, calcium, barium, sodium, magnesium, barium oxide, calcium oxide, iron oxide, magnesium oxide, sodium oxide, titanium dioxide, potassium oxide, strontium oxide, and activated aluminum oxide, as well as carbon nanotubes, activated carbon, phosphorus pentoxide, silanes, as well as calcium hydride, barium hydride, strontium hydride, sodium hydride and lithium aluminum hydride, potassium hydroxide, sodium hydroxide, as well as aluminum acetylacetonate, as well as acetic anhydride, propionic anhydride, butyric anhydride, methyltetrahydrophthalic anhydride, polyacrylic acid, and polyvinyl alcohol, as these materials are particularly suitable as water getters.

In terms of a particularly pronounced binding action on oxygen, the getter material is preferably selected from the group consisting of iron, sodium dithionite, barium oxide, iron(II,III)-oxide, carbohydrazide, activated aluminum oxide, zeolites, activated carbon, sulfites, ascorbates, hydrazine, morpholine, 2-butanone oxime, diethylhydroxylamine, glucose, gallic acid, unsaturated fats and oils, and organometallic oxidation additives based on chelating amines and transition metal complexes, particularly in combination with oxidizable substrate materials.

It is particularly preferable to select the getter material from the group consisting of cobalt chloride, calcium chloride, calcium bromide, lithium chloride, lithium bromide, magnesium chloride, barium perchlorate, magnesium perchlorate, zinc chloride, zinc bromide, aluminum sulfate, calcium sulfate, copper sulfate, barium sulfate, magnesium sulfate, lithium sulfate, sodium sulfate, cobalt sulfate, titanium sulfate, sodium carbonate, sodium sulfate, potassium carbonate, zeolites, calcium, magnesium, barium oxide, calcium oxide, magnesium oxide, sodium oxide, potassium oxide, strontium oxide, activated carbon, phosphorus pentoxide, silanes, calcium hydride, barium hydride, strontium hydride, sodium hydride and lithium aluminum hydride, potassium hydroxide, sodium hydroxide, acetic anhydride, propionic anhydride, butyric anhydride, methyltetrahydrophthalic anhydride, and carbodiimides, as well as mixtures of two or more of the above substances. These materials show a high absorption capacity with respect to at least one of the abovementioned permeates, and particularly with respect to water as well.

"Carbodiimides" are understood to be compounds of the general formula $R^1$—N=C=N—$R^2$, wherein $R^1$ and $R^2$ are organic residues, particularly alkyl or aryl residues, which may be the same or different.

Most preferably, the getter material is selected from the group composed of barium, calcium, calcium sulfate, calcium chloride, calcium oxide, sodium sulfate, potassium carbonate, copper sulfate, magnesium perchlorate, magnesium sulfate, lithium chloride, silicic acids and zeolites, as well as mixtures of two or more of the above substances. These getter materials offer the advantages of being easy to incorporate into the relevant layer of the adhesive tape, showing a high absorption capacity, and being regenerable getter materials. These are understood to refer to substances that under certain conditions are capable of re-releasing the absorbed permeates, e.g. water, thus becoming capable of renewed permeate absorption. This makes possible a method in which any permeates that may have been absorbed by the getter-containing flat structure can largely be removed therefrom before it is brought into contact with the flat structure from which permeates are to be removed, e.g. by drying. In this manner, the full getter capacity in use of the getter-containing flat structure is advantageously made available.

In particular, the getter material is selected from the group consisting of calcium oxide, calcium sulfate, calcium chloride, pyrogenic silicic acids and zeolites, as well as mixtures of two or more of the above substances. These materials show a particularly high capacity to absorb water and other permeates, are largely regenerable, and can be outstandingly incorporated into the flat structure.

In a particular embodiment of the invention, the getter material is selected from calcium oxide, calcium, iron, barium, lithium chloride and cobalt chloride. Due to changes in their optical properties, these substances allow conclusions to be drawn as to the permeate content of the flat structure. Therefore, as long as free getter capacity is still recognizable based on the optical appearance of the flat structure, this can be taken as an indicator that no more, or at the very least only small quantities, of permeates are diffused in the flat structure. Metallic calcium, for example, loses its metallic-opaque appearance and becomes increasingly transparent; cobalt chloride changes its color on absorption of water from blue to pink. Preferably, the getter material is calcium oxide.

Advantageously, the amount of the getter material in the layer of the flat structure II containing the getter material should be at least 1 wt. %, and preferably at least 10 wt. %, relative in all cases to the weight of the layer in question. The maximum amount of the getter material in the various layers of the flat structure II containing the getter material is not limited in any case and can extend to a single layer of pure getter material.

The content essentially depends on the desired absorption capacity of the flat structure II for the respective permeate(s).

For example, if only low absorption capacity is required, the use of a small amount of a getter material having a lower absorption capacity may be sufficient. In a preferred embodiment, the layer containing the getter material or the layers containing the getter material of the flat structure II therefore contain 1 to 5 wt. % of getter material, relative in each case to the total weight of the respective layer.

If an extremely high absorption capacity of the flat structure II is required, however, a relatively higher amount of getter material must be used in the layer containing the getter material, in which case the getter material should also have high absorption capacity.

However, a getter material with a low absorption capacity may also be used if this is advisable due to considerations of cost or tolerability. Within the scope of another preferred embodiment of the method according to the invention, the layer containing the getter material or the layers containing the getter materials of the flat structure II therefore contain(s) 20 to 99 wt. % of getter material relative to the total weight of the respective layer.

If the layer containing the getter material is an adhesive compound, a content of 10 to 80 wt. % relative to the weight of the layer containing the getter material is preferred so that sufficient adhesive properties are retained.

Preferably, the flat structure II containing the getter material has a permeate content of less than 1000 ppm, and particularly preferably, less than 100 ppm, even before application. Here, the unit ppm refers to the ratio of the total weight of the permeate contained to the weight of the flat structure. The permeate content can be determined by gas chromatography according to VDA 277, or in the case of water, according to DIN 53715 (Karl Fischer titration) after storage of the test piece for 24 hours at 23° C. and 50% relative humidity. With low permeate content, the capacity of the getter material of the flat structure is not affected to a great extent by permeate diffusing from the flat structure itself, and the flat structure better fulfills its function as a permeate-removing device.

Particularly advantageously, at least one layer of the flat structure II arranged on the side of the getter-material-containing layer facing away from the flat structure I after bringing into contact of the flat structure II and the flat structure I, and more preferably at least one of the outer layers of the flat structure II, e.g. an outer non-adhesive polymer layer, shows a low permeation rate with respect to the permeate to be immobilized. In the case of water vapor as the permeate, the water vapor transmission rate (WVTR) should preferably be less than 50 g/(m²*d), and particularly preferably less than 20 g/(m²*d) with respect to a layer thickness of 50 μm. In this case, WVTR is measured at 38° C. and 90% relative humidity according to ASTM F-1249, and oxygen transmission rate (OTR) is measured at 23° C. and 50% relative humidity according to DIN 53380, Section 3.

Because of the low permeation rate, especially in production of the flat structure, less permeate diffuses from the environment through the respective layer(s) into the getter-material-containing layer or through the matrix material of the getter-material-containing layer to the getter material, which can therefore perform its function longer or can be used in an even smaller amount, thus reducing costs. Particularly preferably, therefore, at least the matrix material of the getter-material-containing layer of the flat structure II shows a low permeation rate for the permeate to be immobilized.

Preferably, layer or matrix materials based on synthetic rubbers are used, because as a rule, they have relatively low water vapor transmission rates, particularly those based on polyisobutylene and copolymers thereof, polybutene, butyl rubber; styrene block copolymers with polymer blocks formed by polymerization of 1,3-diene, particularly butadiene, isobutylene, and/or isoprene, which can also contain specifically or completely hydrated polymer blocks; and polyolefins and copolymers thereof, polyvinylchloride (PVC), in particular hard PVC, polyvinylidene chloride (PVDC), polyacetylene, fluoropolymers, and polyethylene vinyl alcohol (EVOH).

Particularly preferably, the matrix material of the getter-material-containing layer and/or the material of the outer layer of the flat structure II provided for contact with the flat structure I to be dried is an elastomer, as this elasticity allows improved contact with the flat structure I from which permeate is to be removed and thus improves effectiveness, but without showing adhesive properties.

In an embodiment of the invention, the flat structure II containing the getter material has a substrate material, as this advantageously improves punchability and/or applicability.

Textile flat structures, papers, plastic-coated papers, or films may be used as substrate materials, with films, particularly dimensionally stable plastic or metal films, being preferred. The substrate layer or the substrate material therefore preferably consists of polyesters, and particularly preferably polyethylene terephthalate, for example biaxially stretched polyethylene terephthalate; or polyolefins, particularly polybutene, cycloolefin copolymer, polymethylpentene, polypropylene or polyethylene, for example monoaxially stretched polypropylene, biaxially stretched polypropylene, or biaxially stretched polyethylene. Polyester films show the advantage of providing temperature stability and adding increased mechanical stability. Most preferably, therefore, the substrate layer or substrate material of the flat structure II containing the getter material used in the method according to the invention consists of a polyester film, e.g. biaxially stretched polyethylene terephthalate.

In a preferred embodiment, the substrate material is also provided with a barrier function against one or more specific permeate(s), particularly against water vapor and oxygen, so that the getter material contained in the flat structure II is not partially or even completely saturated during the production and/or storage of the flat structure by permeate diffusing from the environment. A barrier function of this type may be provided by organic or inorganic materials.

Particularly preferably, the substrate material contains at least one inorganic barrier layer. Particularly suitable as inorganic barrier layers are metals deposited in a vacuum (for example by means of vapor deposition, CVD, PVD, PECVD) or under atmospheric pressure (for example by means of atmospheric plasma, reactive corona discharge, or flame pyrolysis), such as aluminum, silver, gold, nickel, or in particular metal compounds such as metal oxides, nitrides or hydronitrides, e.g. oxides or nitrides of silicon, boron, aluminum, zirconium, hafnium, or tellurium, as well as indium tin oxide (ITO). Layers of the above-mentioned embodiments doped with other elements are also suitable.

High power impulse magnetron sputtering and atomic layer deposition, which make it possible to achieve highly impermeable layers at low temperatures of the substrate layer, are to be mentioned as particularly suitable methods for applying an inorganic barrier layer. Preferably, a permeation barrier of the substrate layer with a barrier function or the composite of a substrate layer and a barrier should have a transmission rate with respect to water vapor (WVTR) of <1 g/(m²*d) and/or oxygen (OTR) of <1 cm³/(m²*d*bar) respectively in relation to the thickness of the substrate layer used in the flat structure, i.e. should not be standardized with respect to a specific thickness. In this case, WVTR is measured at 38° C. and 90% relative humidity according to ASTM F-1249, and OTR is measured at 23° C. and 50% relative humidity according to DIN 53380 Part 3.

The thickness of the flat structure II used in the method according to the invention may include all common thicknesses, e.g. from 1 μm up to 3000 μm. The thickness is preferably between 25 and 100 μm, as flexibility and handling properties are particularly positive in this range. An even more preferable range is a thickness of 3 to 25 μm, as in this range the total thickness of the flat structures I and II is not greatly increased, and therefore, for example, more material can be wound onto a roll with a specified diameter.

In producing a flat structure II that can be used in the method according to the invention, the substrate of the flat structure or a temporary substrate material (liner) is preferably coated or printed on one side with a preferably getter-material-containing matrix from solution or dispersion or 100% (for example a melt), or the flat structure is produced by (co)extrusion. Alternatively, production by transferring a preferably getter-material-containing adhesive compound layer by lamination onto a substrate material is possible.

In principle, the layer containing the getter material can be directly applied from the solution, emulsion, or dispersion by a method known to the person having ordinary skill in the art. In this case, the solvent, emulsifier, or dispersing agent used can then be evaporated in an ordinary commercial drier. A solvent-free coating, produced e.g. by scattering, flocking, or powdering processes, is also suitable.

According to the invention, the layer containing the getter material may also be printed. For this purpose, the gravure and silkscreen printing processes of the prior art are suitable. Preferably, rotary printing processes are used in this case. Moreover, coatings may also be applied by spraying. This may take place by rotary spraying processes, or if applicable electrostatically.

This manufacturing process preferably takes place in an environment in which the specific permeate is contained in a low concentration or is virtually absent. As an example, one can mention relative humidity of less than 30%, and preferably less than 15%.

In order to optimize properties, the coating materials used may be mixed with one or more additives such as softeners, fillers, pigments, UV absorbers, light stabilizers, antioxidants, crosslinking agents, and/or elastomers.

The amount or the application weight of a getter-material-containing layer in the flat structure II should preferably be 1 to 200 g/m$^2$, and more preferably 10 to 100 g/m$^2$, with "amount" being understood to refer to the removal of water or a solvent that may be carried out.

The method according to the invention is preferably used in removing permeates from feedstocks and/or intermediate products in the manufacture of organic electronic structures, particularly from substrate, bonding, or covering materials, in particular from printed anodes or cathodes, and even more particularly from printed conductive layers or conductive paths, hole injection layers (HIL) or electron transport layers (ETL), particularly those based on aqueous dispersions of intrinsically conductive polymers such as e.g. PEDOT:PSS, and from specially printed organic light-emitting or absorbing layers, particularly LITI films, as well as from medicated patches, medical, biological, or chemical test structures, in particular test strips, and from feedstocks or intermediate products in the production of electrochemical cells, such as e.g. fuel cells or electrolysis cells.

In a particularly preferred embodiment, the method according to the invention is used for removing permeates from substrate, bonding, or covering films, from hole injection and transport layers, electron transport layers, and from organic light-emitting or absorbing layers.

A further object of the invention is a flat structure that comprises a non-adhesive, elastomeric contact layer and at least one further layer containing a getter material and capable of taking up at least one permeate through the elastomeric contact layer, with the elastomeric contact layer showing a lower elastic modulus at room temperature than at least one further layer contained in the composition of the flat structure, e.g. the substrate layer, in particular as the further layer containing at least one getter material. The elastic modulus is determined according to DIN-EN-ISO 527-3 at 23° C. and 50% relative humidity with type 2 test pieces at a test rate of 50 mm/min.

In this case, the further layer may consist completely of the getter material, or the getter material may be embedded in a matrix material, for example as a dispersed material. The contact layer is provided for contact with the flat structure from which the permeate is to be removed. As the elastomeric contact layer shows a lower elastic modulus than at least one further layer contained in the composition of the flat structure, it does not perform any substrate function, and can therefore advantageously provide a favorable contact. The advantage of this design is the favorable contact via the elastomeric contact layer (outer layer) and the avoidance of direct contact between the getter material and the flat structure from which permeate is to be removed. Because of the reactivity of the getter materials, undesirable chemical interactions might otherwise occur, or mechanical impairment could result from the hardness of some getter materials.

Of course, embodiments of the getter-material-containing flat structure II used in the invention already disclosed in the description of the method according to the invention also apply to the flat structure according to the invention, provided they are not in conflict with the latter. Conversely, embodiments of the getter-material-containing flat structure according to the invention also simultaneously constitute possible embodiments of the flat structure II usable in the method according to the invention.

In an embodiment of the flat structure according to the invention, the getter material is arranged in a matrix material as a dispersed phase. "As a dispersed phase" is understood to mean that the getter material is finely distributed in the corresponding layer(s) of the matrix material. As a rule, there are no restrictions on the shape and size of the getter material particles—other than the limitations inherent in the structure and function of the flat structure or layers, of course. The characteristic "contained as a dispersed phase" includes a molar dispersion and thus a true (molecular) solution of the getter material in the material of the layer in question, as well as a dispersion of getter material primary particles, getter material aggregates, and getter material agglomerates.

The getter material is preferably contained in a matrix material as a dispersed phase.

In addition, the characteristic of being "contained as a dispersed phase" means that said getter material does not constitute a discrete, continuous layer, but is generally present in the form of multiple distributed particles. However, it does not mean that an ideal or statistical distribution of the getter material particles in the layer is required. For example, the getter material particles may by all means be concentrated in certain areas within the layer, or certain areas of a getter-containing layer may also be free of getter material.

The distribution of the getter material as a dispersed phase in a layer of the flat structure according to the invention is more advantageous than a continuous, discrete getter material layer, because the specific surface for absorbing permeates is greater in the case of a continuous layer, and this therefore allows higher absorption capacity for permeates to be achieved.

As a rule, the particle size of the getter material is limited by the requirements imposed by the thickness of the respective layer containing it. One can therefore consider about 200 µm to be the upper limit of particle size, but getter material in the form of particles having a grain size of at most 50 µm should preferably be used.

The flat structure containing getter material according to the invention may by all means contain multiple layers, e.g. a substrate layer, and optionally also additional layers that contain the same or also different getter material(s).

Preferably, the getter material is in the form of particles with a particle size distribution in which a maximum of 1 vol. % of the getter material exceeds the mean layer thickness of the getter-material-containing layer. This is advantageous in that the getter particles do not protrude from the respective layer and have a strongly negative effect on surface properties. In a particularly preferred embodiment, all of the getter material contained in the flat structure according to the invention is present in a particle size distribution in which a maximum of 1 vol. % of the getter material exceeds the mean layer thickness of the respective getter-material-containing layer.

In an alternative preferred embodiment, the getter material is present in the form of particles in a particle size distribution in which at least 10 vol. % of the material exceeds the mean layer thickness of the getter-material-containing layer. This leads to a rough surface and can improve the anchoring of the various layers in the layered composite of the flat structure. Particularly preferably, the entire getter material contained in the flat structure according to the invention is present in a particle size distribution in which at least 10 vol. % of the material exceeds the mean layer thickness of the respective getter-material-containing layer.

"Particles" are understood within the meaning of DIN 53206-1: 1972-08 to refer to primary particles, aggregates, and agglomerates of the getter material or getter materials. "Particle size" is understood to refer to the maximum extension of a particle. Determination of particle size is preferably conducted by laser diffraction according to ISO 13320 (with agglomerates, but not aggregates being dispersed in the dispersion step), but other methods known to the person having ordinary skill in the art are also suitable.

Particularly preferably, all of the getter materials are present in the form of nanoscale particles, i.e. their maximum extension in at least one dimension is less than 500 nm, and particularly preferably less than 200 nm, e.g. less than 100 nm.

Examples of such getter materials include dispersed pyrogenic silica such as Aerosil manufactured by Evonik, calcium oxide nanopowder manufactured by Sigma-Aldrich, calcium chloride CA-Cl—$O_2$NP manufactured by American Elements (Los Angeles), Nanozeolite LTA or FAU manufactured by Nanoscape (Planegg-Martinsried), or nanoscale zeolite Lucidot NCL 40 manufactured by Clariant (Frankfurt).

In a preferred embodiment, the matrix material is a (pressure-sensitive) adhesive, in particular a (pressure-sensitive) adhesive with an inherent barrier action. Examples of such (pressure-sensitive) adhesives, which with a thickness of 50 μm show a water vapor transmission rate of less than 50 g/($m^2$*d) and/or an oxygen transmission rate of less than 5000 g/($m^2$*d*bar), are those disclosed in the applications DE 102010043871(AI), DE 102010043866(AI), DE 102008060113AI, DE 200810062130 AI, DE 200810047964 AI, DE 200910036970 AI, DE 200910036968 AI, US 20090026934 (AI), EP 1469054B1 and EP 0519278B2.

In a further embodiment, the flat structure containing getter material according to the invention comprises at least one layer of a getter material.

The getter material layer is preferably configured as a cohesive, continuous, and uninterrupted layer. However, it can also be present as an interrupted layer or present holes. According to the invention, it is possible to apply a continuous-surface or pierced layer of powdered getter material to another layer provided in the composition of the flat structure, e.g. to a substrate material, and for example bond it to the layer material by means of a thermal and/or mechanical process such as hot rolling. A pierced layer offers the advantage that allowed permeates can more easily pass through the layer, while permeates to be bound are trapped. Moreover, for example, a pierced layer composed of particles has a higher surface than a continuous-surface smooth layer, so the sorption capacity of the material can better manifest itself.

The thickness of the getter material layer depends in particular on the desired absorption capacity for the respective permeates. The minimum thickness of a permeable layer of a getter material having a high absorption capacity, for example a calcium layer, is to be considered the lower limit, which can be estimated to be about 20 nm. The thickness of a film consisting of a metallic getter material, e.g. a barium-zinc-alloy, whose stiffness still allows the flat structure containing getter material to be wound, is to be considered the upper limit. This layer thickness can be estimated to be about 100 μm.

The getter material layer is preferably composed of the (pure) getter material. For example, this can be a vapor-deposited or sputtered layer of a getter material. In a further embodiment, at least one other material is dispersed in the getter layer. An example of this other material is a gas, so that the getter layer is configured in a particularly advantages manner as a foam, in particular an open-cell foam. This offers the advantage of a particularly large active surface of the getter layer. Materials in solid or liquid form may also be dispersed in the getter material layer. For example, these may be materials that bind to a getter material that becomes liquid as it absorbs permeate, e.g. lithium chloride, or to released gases, e.g. hydrogen in the reaction of barium with water. Pore-forming agents, which are removed from the getter material layer after the getter material is formed, may constitute the material dispersed in the getter layer. Examples of these are organic materials that are first incorporated into a getter material layer by electrochemical deposition, and are then dissolved out in a subsequent step, thus leaving a porous getter material structure.

A getter material that is dispersed (as a dispersed phase) in a layer of the flat structure does not constitute a "layer of a getter material" within the meaning of the invention. A "layer of a getter material" according to the invention is present only if the layer is essentially formed by the getter material itself, e.g. as the exclusive material of the layer or as a continuous phase of a dispersion. Percolated particles are also considered to be a continuous phase of a dispersion within the meaning of the invention. "Percolated particles" is understood to refer to particles that interact with one another in such a manner as to form contiguous areas or clusters. As the presence of percolation cannot be directly determined, as an alternative, a content of the getter material of 50% by weight in a dispersion is defined as the percolation threshold.

Possible embodiments of a flat structure containing getter material according to the invention are shown in FIGS. 1 through 4. The figures denote the following.

Figure 1:
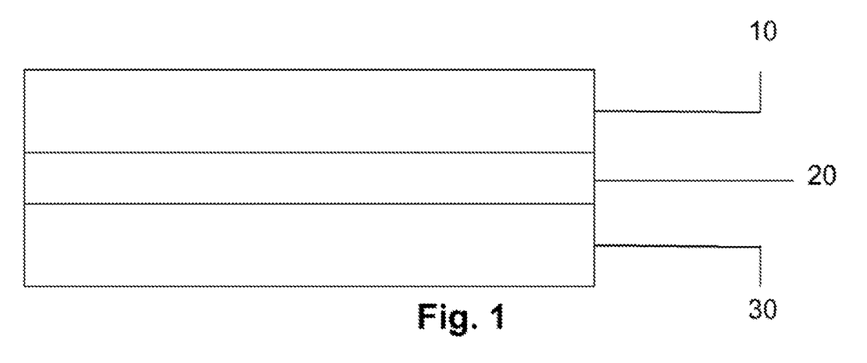
Figure 2:
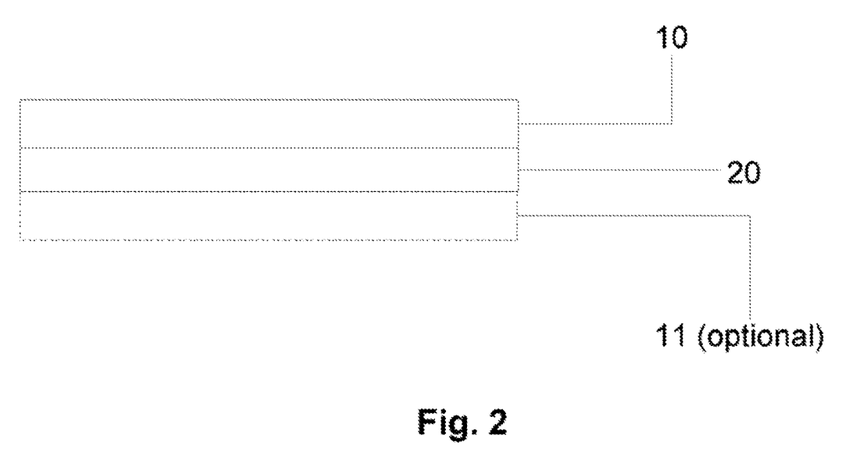

FIG. 1: An embodiment of a flat structure containing getter material according to the invention disclosed herein.
10: Non-adhesive elastomeric contact layer
20: Layer containing getter material
30: Substrate material with WVTR<1 g/$m^2$ d at 38° C. and 90% rH in relation to the thickness of the substrate material used
FIG. 2: An embodiment of a flat structure containing getter material according to the invention disclosed herein.
10: Non-adhesive elastomeric contact layer
20: Layer containing getter material
11: Optionally: further non-adhesive contact layer
FIG. 3: An embodiment of a flat structure containing getter material according to the invention disclosed herein
10: Non-adhesive elastomeric contact layer

Figure 3:
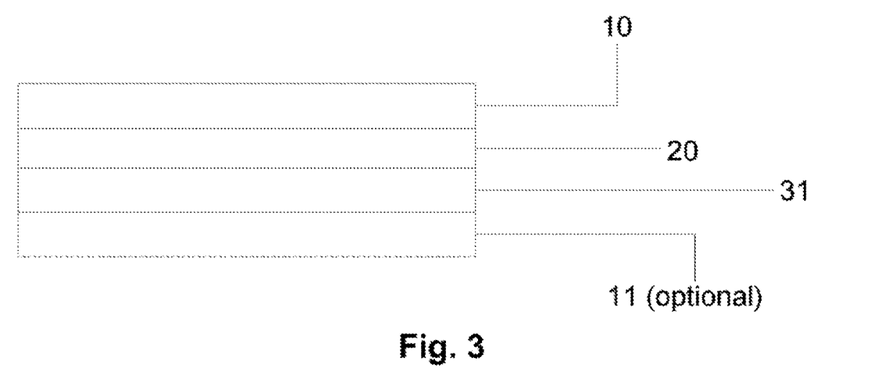

20: Layer containing getter material
31: Substrate material
11: Optionally: further non-adhesive elastomeric contact layer
FIG. 4: An embodiment of a flat structure containing getter material according to the invention disclosed herein.
32: Substrate material
20: Layer containing getter material
31: Substrate material A further object of the invention is the use of a flat structure according to the invention for removing permeates from a flat structure, preferably for at least partial removal of at least water from a flat structure.

EXAMPLE SECTION

Various flat structures containing getter material were manufactured to carry out the method.
Non-Adhesive Elastomer Layers and Adhesives:

In order to produce layers, various materials from a solution were applied to a conventional liner, the Silphan S75 M371 manufactured by Siliconature, by means of a laboratory application device and then dried. The layer thickness after drying was 50 µm. Drying was carried out in all cases at 120° C. for 30 min in a laboratory drying cabinet.
M1: Pressure-Sensitive Adhesive Compound

| | | |
|---|---|---|
| 100 parts | Tuftec P 1500 | SBBS with 30 wt. % block polystyrene content from Asahi. The SBBS as a diblock content of approx. 68 wt. %. |
| 100 parts | Escorez 5600 | Hydrated KW resin with a softening point of 100° C. from Exxon |
| 25 parts | Ondina 917 | White oil from paraffin and naphthenic components from Shell |

A mixture of toluene and acetone in a 2:1 ratio was used as a solvent.
M2: Non-Adhesive Elastomer

| | | |
|---|---|---|
| 100 parts | Tuftec P 1500 | SBBS containing 30 wt. % block polystyrene from Asahi. The SBBS has a diblock content of 68 wt. %. |

A mixture of toluene and acetone in a 2:1 ratio was used as a solvent.
M3: Non-Adhesive Elastomer

| | | |
|---|---|---|
| 100 parts | Oppanol B 150 | PIB from BASF, Mw = 425,000 g/mol |

SBP spirit was used as a solvent.

Water vapor transmission rate (WVTR) was measured at 38° C. and 90% relative humidity according to ASTM F-1249. The indicated value is the mean value of two measurements.

Adhesion to steel was determined analogously to ISO 29862 (Method 3) at 23° C. and 50% relative humidity at a detachment rate of 300 mm/min and detachment angle of 180°. An etched PET film with a thickness of 50 µm was used as a reinforcing film, of the type available from Coveme (Italy). Bonding of the measurement strip was conducted using a roller applicator at a temperature of 23° C. The adhesive tapes were immediately pulled off after application. The indicated value is the mean value of three measurements.

| Designation | WVTR [g/m² d] | Adhesion/steel [N/cm] |
|---|---|---|
| M1 | 68 | 7.1 |
| M2 | 85 | <0.1 (measurement limit) |
| M3 | 6 | <0.1 |

The values determined for adhesion to steel show that compounds M2-M3 are non-adhesive materials.

The following getter materials were used:

| Designation | Description | Commercial name | Supplier |
|---|---|---|---|
| G1 | Calcium oxide | Calcium oxide nanopowder | Sigma-Aldrich |
| G2 | Zeolite 3A | Purmol 3 STH | Zeochem |

The getter materials were incorporated into the compound solutions using a high-speed dispersion disk of a laboratory agitator. The compound solutions were first dried using zeolite beads measuring approx. 1 mm, which were again filtered out before the coating process. The getter-material-containing layers were produced with a thickness of 100 µm.

An approx. 12 µm-thick polyester film coated with an inorganic barrier layer (GX-P-F made by Toppan Printing) was used as substrate material B1. The film has a water vapor transmission rate of 0.06 g/m² d. The getter-material-containing layers were coated on the side with the inorganic barrier layer of the film from the solution and dried.

As substrate material B2, a BOPP film having a thickness of 36 µm manufactured by Pao-Yan, Taiwan, was used, said film having a WVTR of 68 g/m² d.

Table 1 shows an overview of the getter-material-containing flat structures produced as an individual layer or as a structure according to specified figures.

TABLE 1

| | Getter material-filled flat structures: | | | | | |
|---|---|---|---|---|---|---|
| Designation | Non-adhesive elastomer | Matrix material | Matrix | Content of getter [wt. %] | Structure according to FIG. no. | Substrate film |
| T1 | — | M2 | G2 | 10 | Single layer | — |
| T2 | — | M2 | G2 | 20 | Single layer | — |
| T3 | — | M2 | G2 | 40 | Single layer | — |

TABLE 1-continued

Figure 4:
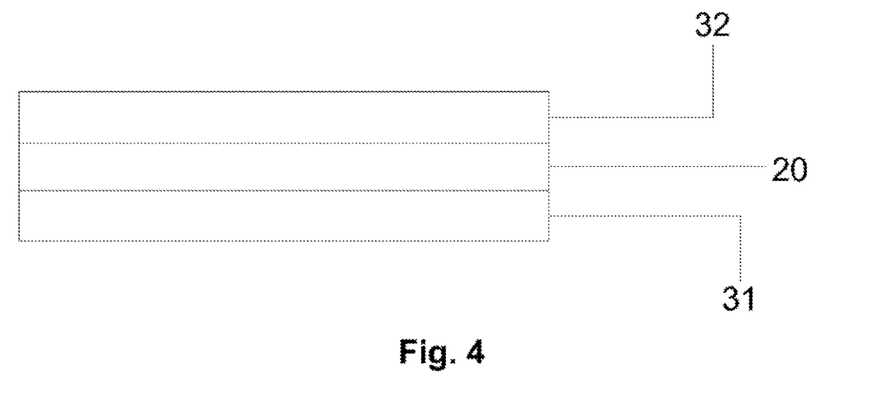

Getter material-filled flat structures:

| Designation | Non-adhesive elastomer | Matrix material | Matrix | Content of getter [wt. %] | Structure according to FIG. no. | Substrate film |
|---|---|---|---|---|---|---|
| T4 | — | M3 | G1 | 10 | Single layer | — |
| T5 | — | M3 | G1 | 20 | Single layer | — |
| T6 | — | M3 | G1 | 40 | Single layer | — |
| T7 | M3 | M1 | G2 | 20 | 1 | B1 |
| T8 | M3 | M1 | G2 | 40 | 1 | B1 |
| T9 | M3 | M1 | G2 | 20 | 3 | B2 |
| T10 | M3 | M1 | G2 | 40 | 3 | B2 |
| T11 | — | M1 | G2 | 20 | 4 | B2 |
| T12 | — | M1 | G2 | 40 | 4 | B2 |
| V1 | — | M1 | G2 | 20 | — | B2 |
| V2 | — | — | — | — | Single layer | — |

As comparative example V1, an adhesive getter-material-containing flat structure was produced from the getter-filled adhesive M1, which was laminated onto the substrate material B2.

As a further comparative example V2, a conventional printer paper with a mass per unit area of 80 g/m² was used. This was first conditioned for 24 h at 23° C. and 50% rH and then predried for 1 h at 120° C. in a drying cabinet.

When an adhesive matrix material (MI) was used, a 50 µm thick layer of a non-adhesive elastomer or the corresponding substrate film was laminated onto said material by means of a laboratory roll laminator, with care being taken to expose the getter-material-containing layer to the surrounding atmosphere for as short a period as possible after drying.

T13: Getter-Material-Containing Multilayer Polyolefin Film

Furthermore, a polyolefin(PO)-based film was produced by flat film coextrusion. It was composed of a 50 µm-thick base layer and two 10 µm-thick outer layers. The base layer was composed of 79.7 wt. % of the polypropylene block copolymer Novolen 2309 L (BASF, melt flow index 6 g/10 min at 230° C. and 2.16 kg, ethylene content of approx. 6.5 wt. %), 20 wt. % of the getter material G2, and 0.3% (w/w) of the HALS stabilizer Tinuvin 770. The base layer material was compounded in-line by flat-film extrusion on a twin-screw extruder from Coperion (d=25 mm, L/d=37) and fed by means of an interconnected melt pump into the feed block of the coextruder. The getter material was supplied to the twin-screw extruder via a side feeder after fusion and homogenizing of the polymer components.

The outer layer was composed of 85 wt. % of the ethylene multiblock copolymer Infuse D9107 (The Dow Chemical Company, d=0.866 g/cm³) and 15 wt. % of the polyethylene LD251 (ExxonMobil, d=0.9155). The outer layer material was extruded on two extruders manufactured by Dr. Collin and fed into the feed block of the coextruder.

A polyester film approx. 50 µm in thickness coated with an inorganic barrier layer (Celle) T0500, Kureha, Japan) was used as a flat structure from which permeate was to be removed, said type of film also being used for encapsulation in organic electronic structures. The film was conditioned for 24 h at 23° C. and 50% rH before use.

A 50 µm-thick layer of a pressure-sensitive adhesive for the encapsulation of organic electronic structures such as that described in DE 102008047964A1, example 3 was used as a further flat structure from which permeate was to be removed. In this case, the adhesive was covered on both sides with a conventional liner of the SILPHAN S36 M372 type (36 µm PET). The flat structure was conditioned for 24 h at 23° C. and 50% rH before use.

Sections of the flat structure containing getter material measuring approx. 10×10 cm² were placed at 23° C. and 50% rH on the non-inorganically coated side of a section of the polyester film of the same size or on the liner of the pressure-sensitive adhesive and thus brought into contact with the flat structure to be dried.

With flat structures T2, T5, T7, and T9, an additional test was conducted in which the flat structures were first stored open for 8 hours at 23° C. and 50% rH and only then placed on the polyester film.

The composites produced in this manner were stored for 14 days at 23° C. in an impermeable package (sealed in an aluminum composite film), with the sample bags being weighed down over the entire surface of the inwardly-positioned sample with a weight of approx. 100 g in order to maintain the contact. The samples were then removed from their package in a glove box (atmosphere: water vapor <5 ppm, oxygen <1 ppm), and the respective flat structure was removed from the polyester film. A section of the polyester film was immediately sealed in a glass container for water content determination. In the case of the adhesive compound, both liners were removed, and the water content of the adhesive compound layer was determined.

Water Content Measurement

Water content was determined according to DIN 53715 (Karl Fischer titration). Measurement was conducted on a Karl-Fischer Coulometer 851 in combination with an oven sampler (oven temperature 140° C.). Triple determination was carried out with an initial weight of approx. 0.3 g. The arithmetic mean of the measurements is given as the water content.

Table 2 shows the results:

TABLE 2

Results of the drying process

| Designation of flat structure containing getter material, applied and then removed | Flat structure to be dried | Water content of flat structure to be dried [ppm] |
|---|---|---|
| — | PET film | 3290 (conditioned film) |
| T1 | | 194 |
| T2 | | 18 |
| T3 | | 9 |
| T4 | | 73 |
| T5 | | 10 |
| T6 | | 8 |
| T7 | | 24 |
| T8 | | 17 |
| T9 | | 20 |
| T10 | | 6 |
| T11 | | 15 |
| T12 | | 10 |
| T13 | | 9 |
| T2 - conditioned 8 h | | 836 |
| T5 - conditioned 8 h | | 90 |
| T7 - conditioned 8 h | | 18 |
| T9 - conditioned 8 h | | 461 |
| V1 | | 16 |
| V2 - conditioned 24 h | | 2810 |
| V2 - dried 1 h | | 460 |
| — | Pressure-sensitive adhesive | 914 (conditioned pressure-sensitive adhesive) |
| T2 | | 32 |
| T3 | | 13 |
| T6 | | 24 |
| T8 | | 14 |
| T10 | | 26 |
| T12 | | 33 |

The results show that outstanding drying results can be achieved that are impossible using the methods of the prior art (V2). Even with pre-dried paper, a water content of less than 200 ppm, in particular less than 50 ppm, cannot be achieved, and this water content is required for materials used in an organic electronic structure.

The water content of the flat structures T1-T6 filled with getter material was also determined prior to application: it was less than 10 ppm in each case. It was below 1000 ppm for flat structures T7-T8 and below 500 ppm for T9-T12. In contrast, the dried paper V2 showed a water content of approx. 9200 ppm. This shows that a permeate content of less than 1000 ppm is advantageous for achieving an extremely low permeate content.

Surprisingly, the tests conducted with the method according to the invention do not generally show inferior release of permeate compared to the comparative example using an adhesive compound containing getter material (V1), although the person having ordinary skill in the art would have expected that simple application of the flat-structure-containing getter material, because of its absent or barely noticeable flowability, would establish less contact with the adhesive substrate, and that the material transport would therefore be reduced. However, because of its adhesive properties, removal of the pressure-sensitive adhesive getter-material-containing flat structure from the PET test substrate was significantly more difficult compared to the non-adhesive flat structures.

Both of the getter materials used are found to be suitable. Surprisingly, tests using a small amount of getter material in the adhesive tape (T1, T4) show only a slight decrease in efficacy compared to those conducted with a higher degree of filling (T2, T3 or T5, T6).

Surprisingly, flat structures with the composition according to FIG. 1 (T7, T8), FIG. 3 (T9, T10), or FIG. 4 (T11, T12), in which material transport must first take place through a low-permeability layer and the permeate must first be removed from this layer and the substrate film, also showed no noteworthy impairment of properties.

Compared to the method with the flat structures T2 and T5, which are laminated after one-hour conditioning onto the test barrier substrate, the advantage of an adhesive compound with a low permeation rate can be seen: after conditioning, T2 shows a significant decrease in drying performance, while the adhesive tape T5 with the significantly less permeable adhesive shows virtually no decrease in drying performance.

The results are similar with the considerably less permeable substrate material B1. With the latter, less of a decrease in drying performance after conditioning is observed than the more permeable substrate material B2 (T7 vs. T9).

In a further test, a composite of the getter-material-containing flat structure T10 was wound together with the PET test substrate into a roll having a running length of approx. 20 m, producing a stack of approx. 70 layers on the roller core. Layering was carried out as described above.

In order to measure water content, samples were taken from linear meter 2 (near the core), 10 (middle of the roll), and 19 (outer side of the roll). It was found that water content at all three sites was within the range of 8-13 ppm, showing outstanding homogeneity of drying throughout the roll. The method according to the invention is also outstandingly well-suited for the drying of stacked flat structures.

The invention claimed is:

1. A method for removing permeates from a flat structure I that is at least partially used in a structure of an organic electronic device, comprising:
    a) directly or indirectly bringing the flat structure I into planar contact with a flat structure II, said flat structure II containing at least one getter material and is capable of taking up at least one permeate from the flat structure I,
    wherein:
    no adhesive bonding takes place between the flat structures I and II,
    the planar contact between the flat structures I and II has a bonding strength of less than 0.5 N/cm, and
    the flat structure II does not remain in the organic electronic device.

2. The method of claim 1, wherein step a) takes place in such a way that the flat structure I and the flat structure II form a composite, and the composite is configured in alternating layers.

3. The method of claim 1, wherein the at least one getter material is selected from the group consisting of cobalt chloride, calcium chloride, calcium bromide, lithium chloride, lithium bromide, magnesium chloride, barium perchlorate, magnesium perchlorate, zinc chloride, zinc bromide, aluminium sulfate, calcium sulfate, copper sulfate, barium sulfate, magnesium sulfate, lithium sulfate, sodium sulfate, cobalt sulfate, titanium sulfate, sodium carbonate, sodium sulfate, potassium carbonate, magnesium carbonate, diatomaceous earth, silicic acids, and zeolites, and layered silicates, iron, calcium, barium, sodium, magnesium, barium oxide, calcium oxide, iron oxide, magnesium oxide, sodium oxide, titanium dioxide, potassium oxide, strontium oxide, activated aluminum oxide, carbon nanotubes, activated carbon, phosphorus pentoxide, silanes, calcium hydride, barium hydride, strontium hydride, sodium hydride, lithium aluminium hydride, potassium hydroxide, sodium hydroxide, aluminium acetyl acetonate and acetic anhydride, propionic anhydride, butyric anhydride, methyltetrahydrophthalic anhydride, polyacrylic acid, and polyvinyl alcohol.

4. The method of claim 1, wherein the at least one getter material is selected from the group consisting of barium, calcium, calcium sulfate, calcium chloride, calcium oxide, sodium sulfate, potassium carbonate, copper sulfate, magnesium perchlorate, magnesium sulfate, lithium chloride, silicic acids, zeolites, and mixtures of two or more of the above substances.

5. The method of claim 1, wherein the flat structure II comprises one or more getter-material containing layers, and each getter-material-containing layer of the flat structure II contains at least 10 wt. % of getter material, relative in each case to total weight of each respective getter-material containing layer.

6. The method as claimed in claim 1, wherein the flat structure II has a permeate content of less than 1000 ppm before application.

7. The method of claim 1, wherein the flat structure II comprises one or more layers and at least one layer of the flat structure II, which is arranged on a side of a getter-material-containing layer facing away from the flat structure I after step a), has a water vapor transmission rate (WVTR) of less than 50 $g/(m^2*d)$.

8. The method of claim 1, wherein a matrix material of a getter-material-containing layer of the flat structure II and/or a material for an outer layer of the flat structure II provided for contact with the flat structure I is an elastomer.

9. The method of claim 1, comprising a further step b) of removing the flat structure I from the flat structure II prior to use of flat structure I in the structure of an organic electronic device.

10. The method of claim 1, wherein the flat structure I has a constant thickness over its entire surface area.

11. The method of claim 1, wherein the flat structure II consists of a layer of getter material.

* * * * *